(12) United States Patent
Nam

(10) Patent No.: US 7,723,769 B2
(45) Date of Patent: May 25, 2010

(54) CAPACITOR DEVICE OF A SEMICONDUCTOR

(75) Inventor: Sang Woo Nam, Chungbuk (KR)

(73) Assignee: Dongbu HiTek Co., Ltd., Seoul (KR)

( * ) Notice: Subject to any disclaimer, the term of this patent is extended or adjusted under 35 U.S.C. 154(b) by 677 days.

(21) Appl. No.: 11/566,059

(22) Filed: Dec. 1, 2006

(65) Prior Publication Data

US 2007/0128793 A1    Jun. 7, 2007

(30) Foreign Application Priority Data

Dec. 5, 2005    (KR) .................. 10-2005-0117489

(51) Int. Cl.
*H01L 27/108*    (2006.01)
*H01L 29/76*    (2006.01)
*H01L 29/94*    (2006.01)

(52) U.S. Cl. ..................................... 257/306

(58) Field of Classification Search ............... 257/303, 257/306, E29.343, E21.648; 438/253, 396
See application file for complete search history.

(56) References Cited

U.S. PATENT DOCUMENTS 7,300,840 B2 *    11/2007    Lin et al. ................. 438/253
2002/0074586 A1 *    6/2002    Harris et al. ............. 257/303

FOREIGN PATENT DOCUMENTS

KR    1020040009749 A    1/2004
KR    1020050005972 A    1/2005

* cited by examiner

*Primary Examiner*—Asok K Sarkar
(74) *Attorney, Agent, or Firm*—Sherr & Vaughn, PLLC

(57) ABSTRACT

Embodiments relate to a capacitor having a high capacitance, a semiconductor device having the same, and a method for manufacturing the semiconductor device. In embodiments, the capacitor may include a lower electrode having a predetermined pattern, a dielectric layer formed on the lower electrode, and an upper electrode formed on the dielectric layer.

20 Claims, 5 Drawing Sheets

CAPACITOR DEVICE OF A SEMICONDUCTOR

The present application claims priority under 35 U.S.C. 119 and 35 U.S.C. 365 to Korean Patent Application No. 10-2005-0117489 (filed on Dec. 5, 2005), which is hereby incorporated by reference in its entirety.

BACKGROUND

Embodiments relate to a semiconductor device. Embodiments also relate to a capacitor device that may have a high capacitance, a semiconductor device having the same, and a method for manufacturing the semiconductor device.

Merged memory logic (MML) is a device in which a memory cell array, for example, dynamic random access memory (DRAM), and an analog circuit or peripheral circuits may be integrated with each other in a single chip. With the development of such merged memory logic, various functions may be significantly improved. In addition, a more highly integrated and faster semiconductor device may be attained.

The analog circuit in the MML may include a capacitor, for example, a metal-insulator-metal ("MIM") capacitor that may operate at high speed. Such a MIM capacitor should have small resistivity and no parasitic capacitance.

A related art MIM capacitor may be made by sequentially forming a titanium Ti layer, a titanium nitride TiN layer, a first metal layer, a dielectric layer, a second metal layer, and a photo resist layer on a semiconductor substrate including conductive layer. The second metal layer, the dielectric layer, the first metal layer, the titanium nitride TiN layer, and the titanium Ti layer may be sequentially patterned using the photo resist layer as a mask.

A MIM capacitor should have a high capacitance. The capacitance of a MIM capacitor may be proportional to a dielectric constant and a facing area of the first and second metal layers, but may be inversely proportional to a distance between the first and second metal layers.

Accordingly, the higher the dielectric constant is, the greater a facing area is. Additionally, the shorter a distance is between the metal layers, the greater the capacitance of the MIM capacitor.

However, since a MIM capacitor may be made by sequentially forming the first metal layer, the dielectric layer, and the second metal layer on a plane, there is an upper limit to the capacitance of the MIM capacitor.

Moreover, because a higher degree of integration is desirable, a reduced size of a MIM capacitor would be beneficial. However, there is a limit as to how small the MIM capacitor can be made according to related art.

SUMMARY

Embodiments relate to a capacitor device, a semiconductor device having the same, and a method for manufacturing the semiconductor.

Embodiments relate to a capacitor device having a high capacitance, a semiconductor device having the same, and a method for manufacturing the semiconductor device.

Embodiments relate to a capacitor device that may have a reduced size, a semiconductor device having the same, and a method for manufacturing the semiconductor device.

According to embodiments, a capacitor device may include a lower electrode having a predetermined pattern, a dielectric layer formed on the lower electrode, and an upper electrode formed on the dielectric layer.

According to embodiments, a semiconductor device may include a first insulating layer formed on a semiconductor substrate, a capacitor device formed on the first insulating layer, a metal interconnection formed on the same plane as that of the capacitor device to be spaced apart from the capacitor device by a predetermined distance, and a second insulating layer formed between the capacitor device and the metal interconnection, wherein the capacitor device includes a lower electrode, a dielectric layer, and an upper electrode, and a predetermined pattern may be formed at the lower electrode.

According to embodiments, a method for manufacturing a semiconductor device may include forming a first insulating layer on a semiconductor substrate, forming a capacitor device and a metal interconnection on the first insulating layer, the capacitor device including a lower electrode, a dielectric layer, and an upper electrode, and the metal interconnection being spaced apart from the capacitor device by a predetermined distance, and forming a second insulating layer between the capacitor device and the metal interconnection, wherein a predetermined pattern may be formed at the lower electrode.

DETAILED DESCRIPTION OF EMBODIMENTS

Figure 1:
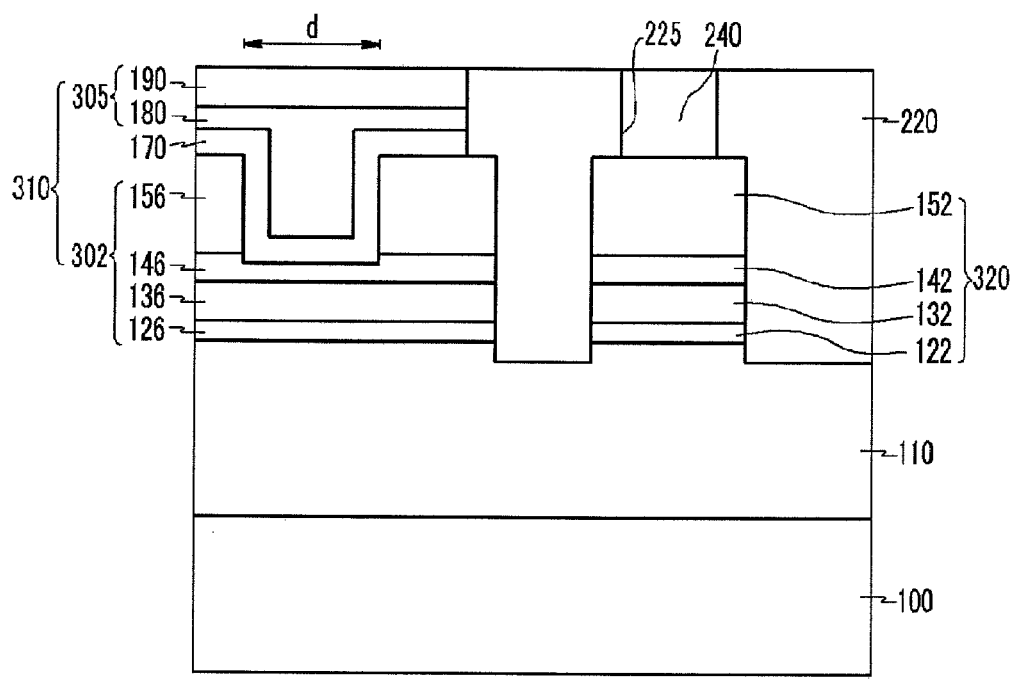
FIG. 1 is an example drawing illustrating a semiconductor device according to embodiments.

Referring to FIG. 1, a conductive layer (not shown) may be formed on semiconductor substrate 100. Inter-metal dielectric layer 110 may be formed on semiconductor substrate 100. MIM capacitor 310 and first metal interconnection 320 may be formed on inter-metal dielectric layer 110. Second metal interconnection 240 may be formed on first metal interconnection 320. Interconnection-dielectric layer 220 may be formed at sidewalls of MIM capacitor 310, and first and second metal interconnections 320 and 240, and above inter-metal dielectric layer 110 and may form a stepped portion between MIM capacitor 310, and first and second metal interconnections 320 and 240.

First metal interconnection 320 may include contact auxiliary layer 122, lower metal layer 132, etch stop layer 142, and upper metal layer 152, which may be sequentially formed.

MIM capacitor 310 may include lower electrode 302, dielectric layer 170, and upper electrode 305, which may be sequentially formed. Lower electrode 302 may include contact auxiliary layer 126, lower metal layer 136, etch stop layer 146, and upper metal layer 156. Corresponding layers of lower electrode 302 and first metal interconnection 320 may be formed of the same material as each other.

Contact auxiliary layers 122 and 126 may have a dual layer of titanium/titanium nitride. Lower metal layers 132 and 136, and upper metal layers 152 and 156 may be formed of aluminum. Etch stop layers 142 and 146 may be formed of titanium.

Upper electrode 305 may include titanium layer 180 and titanium nitride layer 190.

A predetermined pattern may be formed at MIM capacitor 310 and upper metal layer 156. A pattern may have width "d" ranging from approximately 0.08 µm to 1 µm. A pattern may be formed to expose etch stop layer 146. The pattern may formed to expose lower metal layer 136 formed at a lower portion of etch stop layer 146.

Dielectric layer 170 may be formed inside the pattern, and upper electrode 305 may be formed on dielectric layer 170. Accordingly, upper electrode 305 may face lower electrode 302 along a side and a lower surface of the pattern. Thus, a facing area between upper electrode 305 and lower electrode 302 may be significantly increased as compared to a design where an upper electrode and a lower electrode face each other on a plane. In embodiments, a capacitance of MIM capacitor 310 may be high, and may be significantly increased as compared with that of the related art.

Although FIG. 1 shows one pattern, a plurality of patterns may be formed. In embodiments, a plurality of patterns may be formed, and a capacitance of MIM capacitor 310 may be high, and may be higher than embodiments where only one pattern is formed. Hence, a capacitance of MIM capacitor 310 may be increased corresponding to the number of patterns. The number of the patterns can be determined based on a margin of a device and the like.

In embodiments, a pattern may be formed at lower electrode 302, and an MIM capacitor having a small size may therefore be formed. The size of the MIM capacitor may be smaller than that of the related art.

FIGS. 2 through 8 are drawings illustrating a method for manufacturing a semiconductor device according to embodiments of the present invention.

Figure 2:
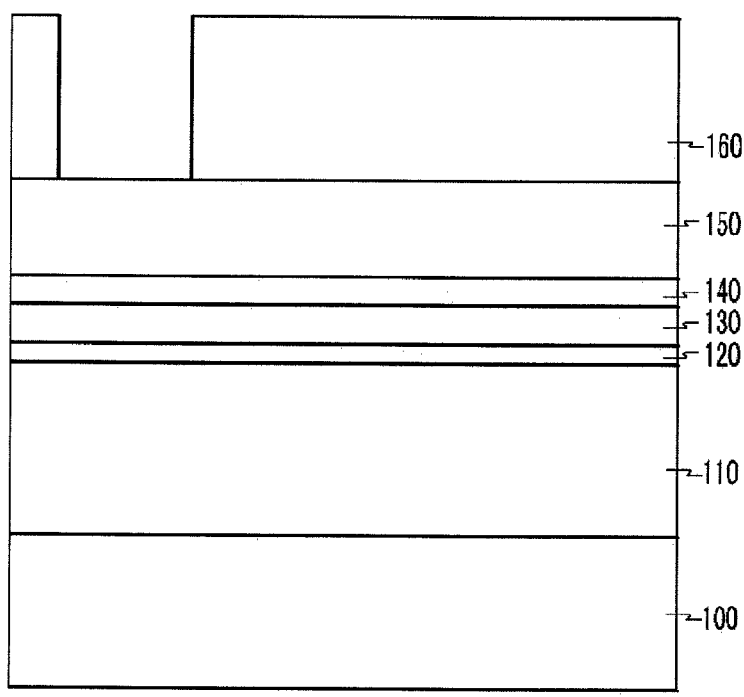
FIGS. 2 through 8 are example drawings illustrating a method for manufacturing a semiconductor device according to embodiments.

Referring to FIG. 2, a conductive layer (not shown) may be formed on semiconductor substrate 100. An inter-metal dielectric layer 110 may be formed on semiconductor substrate 100, including the conductive layer.

Contact auxiliary layer 120, lower metal layer 130, etch stop layer 140, upper metal layer 150, and first photo resist layer 160 may be sequentially formed on inter-metal dielectric layer 110. In embodiments, inter-metal dielectric layer 110 may be formed of, for example, undoped silicate glass (USG), fluorine-doped silicate glass (FSG), BPSG, and/or TEOS. The contact auxiliary layer 120 may have a dual layer of titanium/titanium nitride. Lower metal layer 130 and upper metal layer 150 may be formed of aluminum. Etch stop layer 140 may be formed of titanium.

In embodiments, contact auxiliary layer 120 and etch stop layer 140 may be formed to have a thickness ranging from approximately 200 Å to 500 Å, and lower metal layer 130 may be formed to have a thickness ranging from approximately 500 Å to 1,000 Å.

A photolithography process may be performed in first photo resist layer 160 to form a mask pattern having a predetermined width "d."

Figure 3:
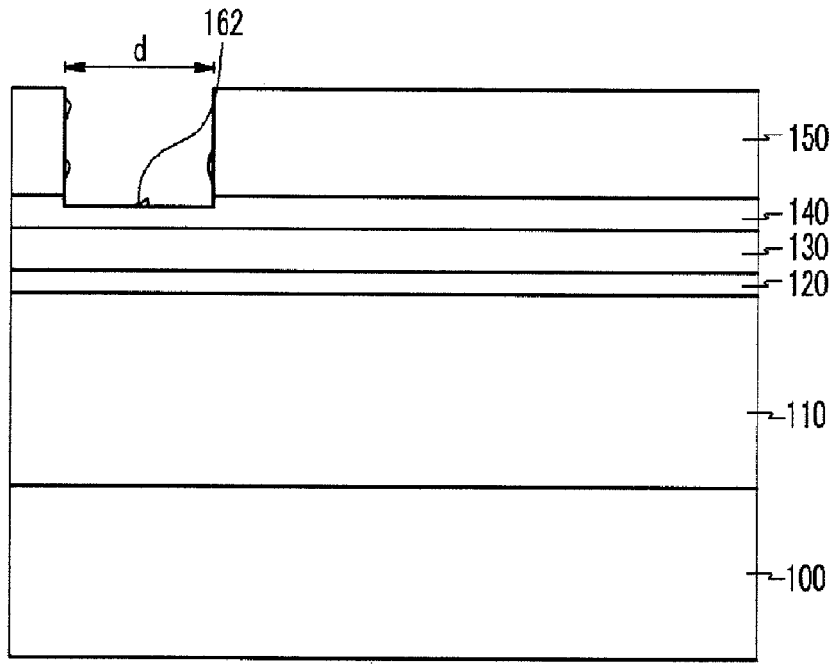

Referring to FIG. 3, upper metal layer 150 may be patterned using first photo resist layer 160 as a mask to form a pattern corresponding to width "d" at upper metal layer 150. The pattern may be patterned so etch stop layer 140 or the lower metal layer 130 may be exposed. Etch stop layer 140 may be formed to indicate a stop time of an etching process during patterning.

First photo resist layer 160 may be stripped, for example by a plasma process using oxygen $O_2$.

As a result of such an etch process, polymer can be attached to a side or a lower surface of upper metal layer 150. Such polymer may be easily removed, for example by a wet etch process.

Figure 4:
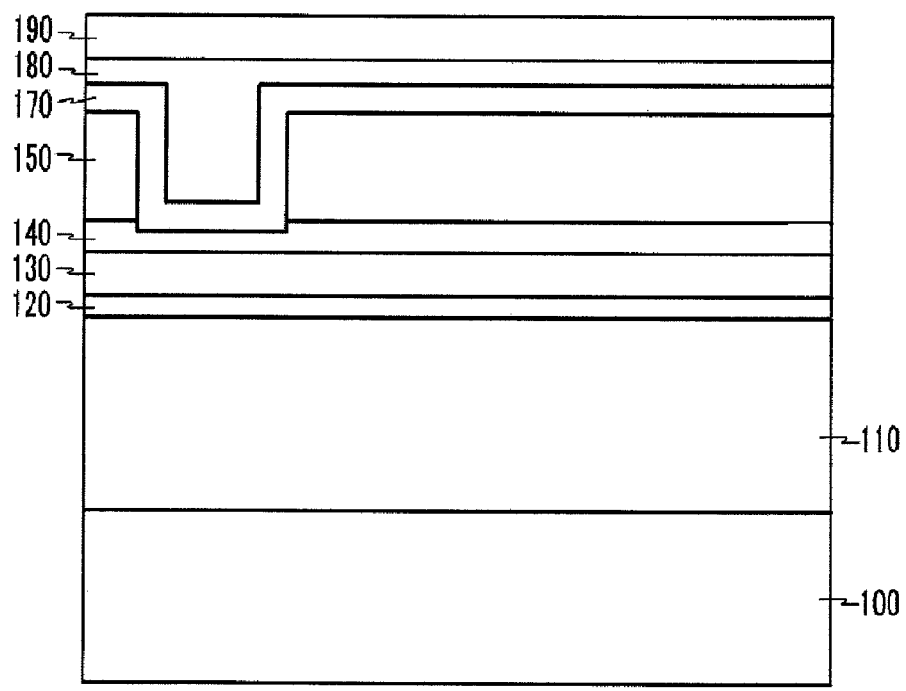

Referring to FIG. 4, dielectric layer 170 may be formed on upper metal layer 150 including a pattern. Further, titanium layer 180 and titanium nitride layer 190 may be sequentially formed on dielectric layer 170. In embodiments, dielectric layer 170 may be formed of nitride or oxide, and may have a thickness ranging from approximately 200 Å to 1,500 Å. Titanium layer 180 may be formed to have a thickness ranging from 500 Å to 1,000 Å. Further, titanium nitride layer 190 may be formed to have a thickness ranging from 500 Å to 1,500 Å.

Figure 5:
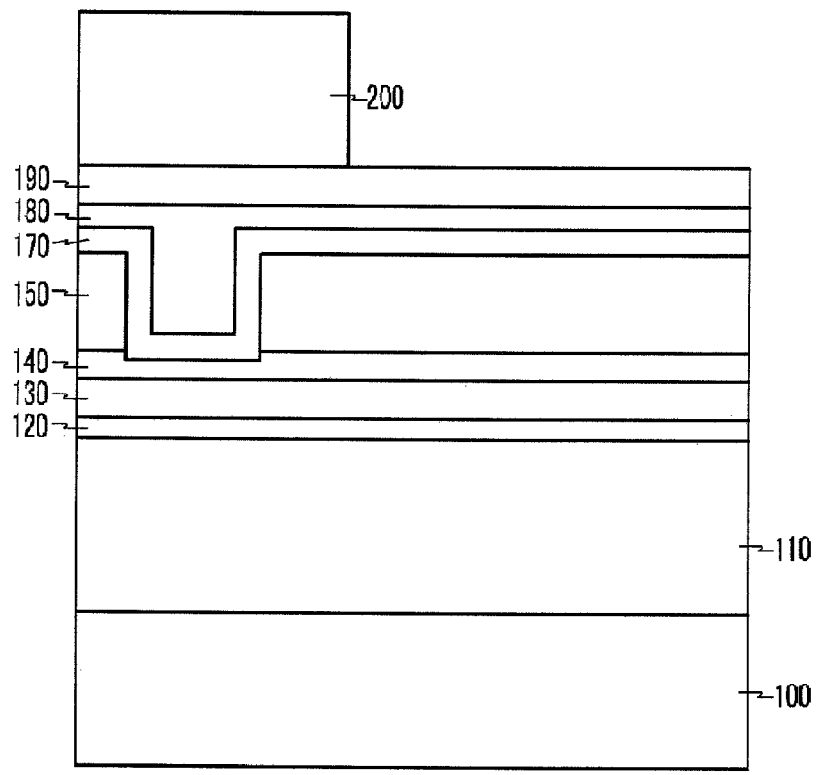

Referring to FIG. 5, second photo resist layer 200 may be formed on titanium nitride layer 190. A photolithography process may be performed in second photo resist layer 200 to form a pattern, in which titanium nitride layer 190 may be exposed to a periphery of the pattern formed at upper metal layer 150.

Figure 6:
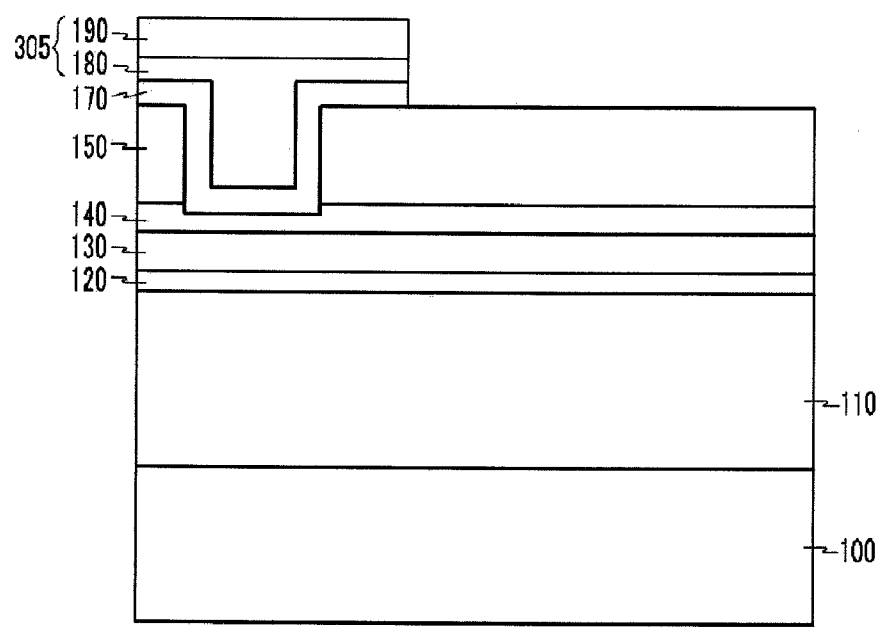

Referring to FIG. 6, titanium nitride layer 190, titanium layer 180, and dielectric layer 170 may be sequentially patterned using second photo resist layer 200 as a mask to form lower electrode 305. Accordingly, upper metal layer 150 may be exposed to a patterned region. Second photo resist layer 200 may be stripped, for example by a plasma process using oxygen $O_2$.

Figure 7:
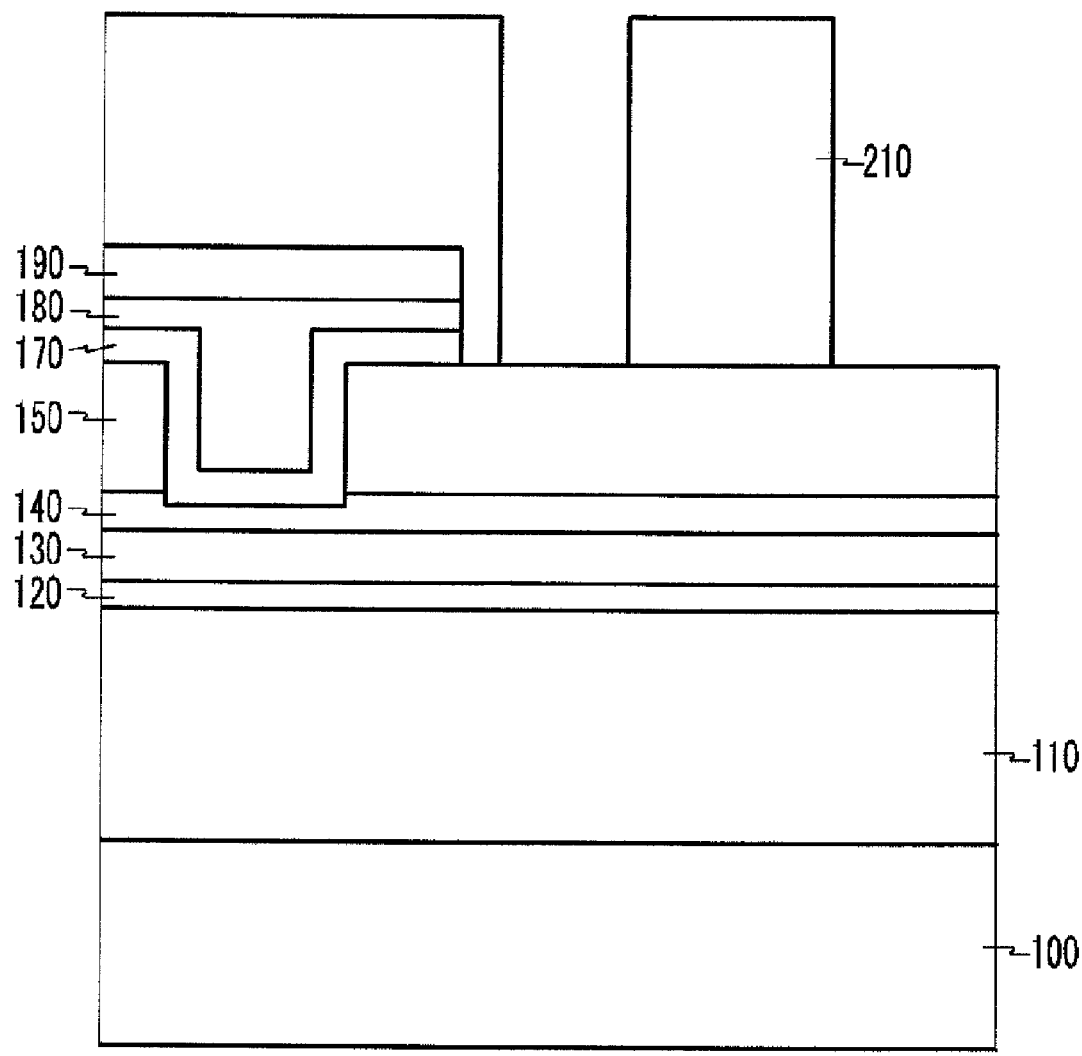

Referring to FIG. 7, third photo resist layer 210 may be formed on titanium nitride layer 190, and a photolithography process may be carried out in third photo resist layer 210, for example to form a pattern to which upper metal layer 150 is exposed.

Upper metal layer 150, etch stop layer 140, lower metal layer 130, and contact auxiliary layer 120 may be sequentially patterned using third photo resist layer 210 as a mask, and may form lower electrode 302 and first metal interconnection 320. MIM capacitor 310 composed of lower electrode 302, dielectric layer 170, and upper electrode 305 may thus be formed. Third photo resist layer 210 may be stripped, for example through a plasma process using oxygen $O_2$.

Figure 8:
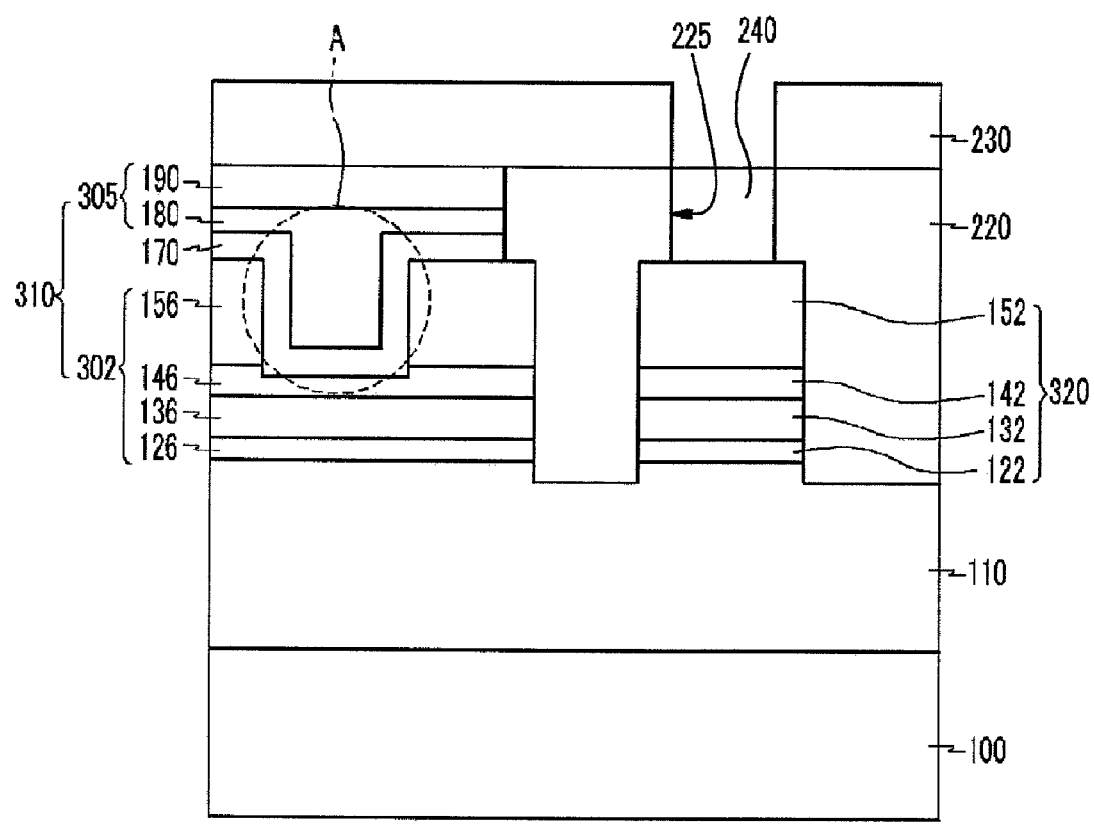

Referring to FIG. 8, first metal interconnection 320 may include contact auxiliary layer 122, lower metal layer 132, etch stop layer 142, and upper metal layer 152. Further, lower electrode 302 may include contact auxiliary layer 126, lower metal layer 136, etch stop layer 146, and upper metal layer 156. Corresponding layers of lower electrode 302 and first metal interconnection 320 may be formed of the same materials as each other.

As upper metal layer 156 included in lower electrode 302 may have an uneven structure A, a facing area between lower electrode 302 and upper electrode 305 may be increased. Accordingly, a capacitance may be increased, and may be greater than a device having a flat facing area between a lower electrode and an upper electrode.

Interconnection-dielectric layer 220 may be formed on semiconductor substrate 100, and a chemical mechanism polishing (CMP) process may be performed to pattern the resulting object to a height conforming to titanium nitride layer 190.

Fourth photo resist layer 230 may be formed on titanium layer 190 and interconnection-dielectric layer 220, and a photolithography process may be carried out in fourth photo resist layer 230 to form a pattern to which interconnection-dielectric layer 220 formed on first metal interconnection 320 may be exposed.

Interconnection-dielectric layer 220 may be patterned using fourth photo resist layer 230 as a mask to form a pattern to which upper metal layer 152 of first metal interconnection 320 may be exposed.

Pattern 225 may be filled with a metal thin film to form a second metal interconnection 240, which may be electrically connected to first metal interconnection 320.

In embodiments, because an uneven structure may be formed at a lower electrode of an MIM capacitor, a facing area between a lower electrode and an upper electrode may be increased, which may increase a capacitance of an MIM capacitor.

Moreover, in embodiments, since a plurality of uneven structures may be formed at a lower electrode of a MIM capacitor, it may achieve a capacitance greater than that of one uneven structure.

In addition, in embodiments, an MIM capacitor having a reduced size can be realized in a limited lay out. Accordingly, a higher degree of integration of the semiconductor device may be achieved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device comprising:
   a lower electrode having a prescribed pattern, wherein the lower electrode comprises a contact auxiliary layer, a lower metal layer, an etch stop layer, and an upper metal layer wherein the contact auxiliary layer comprises a double layer of titanium/titanium nitride;
   a dielectric layer formed over the lower electrode; and
   an upper electrode formed over the dielectric layer.

2. The device of claim 1, wherein the dielectric layer and the upper electrode are formed over the pattern.

3. The device of claim 1, wherein the upper electrode and the lower electrode are configured to face each other along a side and a lower surface of the pattern.

4. The device of claim 1, wherein the lower metal layer and the upper metal layer comprise aluminum.

5. The device of claim 1, wherein the etch stop layer comprises titanium.

6. The device of claim 1, wherein the pattern penetrates the upper metal layer to expose the etch stop layer.

7. The device of claim 1, wherein the pattern penetrates the upper metal layer and the etch stop layer to expose the lower metal layer.

8. The device of claim 1, wherein the pattern comprises a plurality of patterns.

9. The device of claim 1, wherein a width of the pattern ranges from 0.08 μm to 1 μm.

10. The device of claim 1, wherein the upper electrode comprises a titanium layer and a titanium nitride layer.

11. A device comprising:
    a first insulating layer formed over a semiconductor substrate;
    a capacitor formed over the first insulating layer;
    a metal interconnection formed in a same plane as that of the capacitor and configured to be spaced apart from the capacitor by a prescribed distance; and
    a second insulating layer formed between the capacitor and the metal interconnection,
    wherein the capacitor comprises a lower electrode, a dielectric layer, and an upper electrode, and a prescribed pattern is formed at the lower electrode and the lower electrode comprises a contact auxiliary layer, a lower metal layer, an etch stop layer, and an upper metal layer wherein the contact auxiliary layer comprises a double layer of titanium/titanium nitride.

12. The device of claim 11, wherein the dielectric layer and the upper electrode are formed at the pattern.

13. The device of claim 11, wherein the upper electrode and the lower electrode are configured to face each other along a side and a lower surface of the pattern.

14. The device of claim 11, wherein the lower metal layer and the upper metal layer comprise aluminum.

15. The device of claim 11, wherein the etch stop layer comprises titanium.

16. The device of claim 11, wherein the pattern penetrates the upper metal layer to expose the etch stop layer.

17. The device of claim 11, wherein the pattern penetrates the upper metal layer and the etch stop layer to expose the lower metal layer.

18. The device of claim 11, wherein the pattern comprises a plurality of patterns.

19. The device of claim 11, wherein a width of the pattern ranges from 0.08 μm to 1 μm.

20. The device of claim 11, wherein the upper electrode comprises a titanium layer and a titanium nitride layer.

* * * * *